United States Patent
Kitamura (10) Patent No.: US 6,399,953 B1
(45) Date of Patent: Jun. 4, 2002

(54) SCANNING ELECTRONIC MICROSCOPE AND METHOD FOR AUTOMATICALLY OBSERVING SEMICONDUCTOR WAFER

(75) Inventor: Tadashi Kitamura, Chiba (JP)

(73) Assignee: Seiko Instruments Inc. (JP)

( * ) Notice: Subject to any disclaimer, the term of this patent is extended or adjusted under 35 U.S.C. 154(b) by 0 days.

(21) Appl. No.: 09/227,231

(22) Filed: Jan. 8, 1999

(30) Foreign Application Priority Data

Jan. 9, 1998 (JP) .......................................... 10-003387
Jan. 8, 1999 (JP) .......................................... 11-002875

(51) Int. Cl.$^7$ .............................................. H01J 37/28
(52) U.S. Cl. .................. 250/491.1; 250/310; 250/492.2
(58) Field of Search .......................... 250/491.1, 492.2, 250/397, 358, 310

(56) References Cited

U.S. PATENT DOCUMENTS

| | | | | | |
|---|---|---|---|---|---|
| 4,413,186 A | * | 11/1983 | Uema | ...................... | 250/492.2 |
| 4,864,629 A | * | 9/1989 | Deering | ...................... | 382/34 |
| 4,926,489 A | * | 5/1990 | Danielson | ...................... | 382/8 |
| 5,332,898 A | * | 7/1994 | Toro-Lira et al. | ........... | 250/310 |
| 5,412,210 A | * | 5/1995 | Todokoro et al. | ........ | 250/492.2 |
| 5,497,007 A | * | 3/1996 | Uritsky et al. | ........... | 250/491.1 |
| 5,550,372 A | * | 8/1996 | Yasue | ......................... | 250/310 |
| 5,563,702 A | * | 10/1996 | Emery et al. | .................. | 356/73 |
| 5,861,320 A | * | 1/1999 | Shiraishi | ...................... | 438/16 |

FOREIGN PATENT DOCUMENTS

JP     410256350     * 9/1998

* cited by examiner

*Primary Examiner*—Bruce Anderson
(74) *Attorney, Agent, or Firm*—Adams & Wilke (57) ABSTRACT

A method for automatically recognizing a stage position of a feature of a semiconductor wafer comprises the steps of identifying a feature of a semiconductor wafer disposed at a predetermined distance from an alignment mark on the semiconductor wafer and obtaining an electron beam image, an optical image or a differential image thereof of the feature of the semiconductor wafer. A normalized correlation coefficient from the image of the feature is then calculated, and a stage position of the feature of the semiconductor wafer is automatically recognized in accordance with the normalized correlation coefficient.

8 Claims, 4 Drawing Sheets

| 28 | 19 | 38 |
|---|---|---|
| 18 | (59) | 128 |
| 128 | 204 | 200 |

Abnormal region image

| 19 | (25) | 51 |
|---|---|---|
| (30) | 252 | (135) |
| 135 | (204) | 190 |

Reference image

FIG. 5

SCANNING ELECTRONIC MICROSCOPE AND METHOD FOR AUTOMATICALLY OBSERVING SEMICONDUCTOR WAFER

BACKGROUND OF THE INVENTION

The present invention relates to a scanning electronic microscope (SEM) for a step of controlling the yield of wafers.

An important step for controlling the yield of wafers has been to detect abnormal regions on the surface of wafers and to identify regions having process-related defects from information based on the observation of the features thereof and the analysis of elements.

Such detection of abnormal regions and observation of features have conventionally been carried out with optical wafer surface inspectors utilizing scattered laser beams, inspectors of foreign substances on wafer surface such as optical wafer surface inspectors which perform die-to-die comparison, review stations and the like. A review station is an optical observation apparatus of foreign substances which is linked with a defect and foreign substance detector when used.

However, as wiring patterns on wafers become finer, it has become impossible to observe closely features of abnormal regions to be observed with a laser system when they are in sizes of 0.3 $\mu$m or less.

Conventional scanning electronic microscopes for observing the features on wafers have been scanning electronic microscopes having a stage for the observation of wafers added with automatic wafer loader, and abnormal regions have been observed with the following steps. (A3) among the following steps has been automatically carried out by a CPU. A1 through A11 below are steps for inspecting a single wafer as a unit.

(A1) A wafer is loaded into a scanning electronic microscope.

(A2) An inspector of foreign substances on wafer surface acquires information on features on the wafer and information on abnormal regions.

(A3) A coordinate transformation coefficient between the coordinate systems of a wafer surface inspector based on the recognition of wafer outline and the scanning electronic microscope is automatically obtained according to Japanese Patent Publication Tokkaihei-06-174644 "Method for Automatically Setting Coordinate Transformation Coefficient".

(A4) The coordinate positions of alignment marks on the wafer are observed to obtain a coordinate transformation coefficient between the coordinate systems of the wafer surface inspector and the scanning electronic microscope according to Japanese Patent Publication Tokkaihei-06-258240 "Method for Coordinate Transformation".

(A5) The stage is moved to the positions of abnormal regions identified by the inspector of foreign substances on wafer surface.

(A6) Adjustment of the lens system including focusing is carried out to acquire electron beam images or optical images.

The present invention relates to a scanning electronic microscope (SEM) and to techniques for automatically observing features on a semiconductor wafer to control the yield of the semiconductor wafers.

(A7) The abnormal regions are recognized.

(A8) The stage is moved to the positions thereof.

(A9) Magnifications in accordance with the size of the abnormal regions are set to acquire electron beam images or optical images.

(A10)) The process proceeds to the next step if the acquisition of images of all abnormal regions to be observed is completed and, if not, the process continues from step (A5) on the next abnormal region.

(A11) The wafer is unloaded from the scanning electronic microscope to terminate the process.

A problem arises here in that a scanning electronic microscope for observing features on a wafer has throughput which is slower than a laser system by a factor of several dozens and is backward in automation.

As a solution to this, there has been a need for full automation of conventional scanning electronic microscopes for observing features on wafers and improving operator throughout.

SUMMARY OF THE INVENTION

In order to solve the above-described problems, information on wafers to be observed is acquired from an operator, and steps for observing features on the wafers are sequentially and automatically carried out by a CPU.

The observation of repetitive patterns such as those of a memory cell region of a DRAM (hereinafter referred to as "repetitive pattern observation method") is carried out with the following steps. The steps other than (B1) are all automatically performed by a CPU.

(B1) Information on the type of wafers to be observed and information on queries from an inspector of foreign substances on wafer surface regarding the wafers is acquired from an operator. The information on the type of wafers to be observed is the size of the wafers (e.g., 6 inches and 8 inches), origin marks on the wafers (e.g., an orientation flat and a notch) and the like. The information on queries from the inspector of foreign substances on wafer surface is device IDs, process IDs, lot IDs, slot IDs and the like.

C1 through C8 described below are steps preceding alignment which are a pre-process.

(C1) Wafers are loaded into a scanning electronic microscope in accordance with the information on the type of wafers to be observed.

(C2) Information on the positions and sizes of abnormal regions is acquired from the inspector of foreign substances on wafer surface in accordance with the information on queries from the inspector of foreign substances on wafer surface.

(C3) A coordinate transformation between the coordinate systems of a wafer surface inspector based on the recognition of wafer outline and the scanning electronic microscope is automatically obtained according to Japanese Patent Publication Tokkaihei-06-174644 "Method for Automatically Setting Coordinate Transformation Coefficient".

(C4) Movement is made to the positions of alignment marks or defects at a predetermined distance from the alignment marks. Specifically, the stage is moved such that the positions of the alignment marks or the features at a predetermined distance from the alignment marks are centered in the field of view. Corners of the die or cross marks are frequently used as the alignment marks.

(C5) Automatic adjustment of the lens system including automatic focusing is carried out to acquire electron beam images or optical images.

(C6) The stage positions of the features are recognized from the images.

(C7) The process proceeds to the next step if the observation of all of the alignment marks or the features at a predetermined distance from the alignment marks is completed and, if not, continues from (C4) for the next alignment mark. The alignment marks or the features a predetermined distance from the alignment marks are normally measured at three points or more.

(C8) A coordinate transformation coefficient between the coordinate systems of the wafer surface inspector and the scanning electronic microscope is obtained by observing the coordinate positions of the alignment marks on the wafer using the above-described stage position according to the Japanese Patent Publication Tokkaihei-06-258240 "coordinate transformation method". D1 through D7 below are steps for acquiring images of abnormal regions using the repetitive pattern observing method.

(D1) The stage is moved such that the abnormal regions whose positions and sizes have been acquired from the inspector of foreign substances on wafer surface are centered in the field of view.

(D2) Automatic adjustment of the lens system including automatic focusing is carried out to acquire electron beam images or optical images as images of the abnormal regions (image acquisition at a low magnification).

(D3) Partial images of the abnormal regions are recognized from the images of the abnormal regions.

(D4) Visual inspection is carried out to classify the abnormal regions. That is, shorts (shortcircuits), breaks (breakage), scratches and the like are identified.

(D5) The stage is moved to positions where they are detected.

(D6) Magnifications in accordance with the sizes of the detected abnormal regions are set to acquire electron beam images or optical images (image acquisition at high magnifications).

(D7) The process proceeds to the next step if the acquisition of all of the images of the abnormal regions to be observed is completed and, if not, continues from (D1) for the next abnormal region.

(E1) The wafers are unloaded from the scanning electronic microscope.

(E2) The images acquired on the abnormal regions, information on the classification and the like are provided to the operator.

The observation of features other than repetitive patterns (referred to as die-to-die observation method) is carried out with the following steps.

The above-described (B1)) through (C3) are carried out.

F1 through F9 below represent steps for acquiring images of abnormal regions by the die-to-die observation method.

(F1) The stage is moved to the positions on an adjacent die (a unit of chips on a wafer) which correspond to the position of the abnormal regions acquired by the inspector of foreign substances on wafer surface.

(F2) Automatic adjustment of the lens system including automatic focusing is carried out to acquire electron beam images or optical images as reference images. The dies on a wafer are all in the same configuration. A movement is made to regions of a die other than the dies having abnormal regions at the same distance from the origin of the die, and images acquired there are images having no abnormal region, i.e., reference images.

(F3) The stage is moved to the positions of the abnormal regions acquired by the inspector of foreign substances on wafer surface.

(F4) Automatic adjustment of the lens system including automatic focusing is carried out to acquire electron beam images or optical beams as images of abnormal regions.

(F5) Partial images of the abnormal regions are recognized from the reference images and images of the abnormal regions.

(F6) The abnormal regions are classified.

(F7) The stage is moved to the positions of detection.

(F8) Magnification is set in accordance with the sizes of the detected abnormal regions to acquire electron beam images or optical images.

(F9) The process proceeds to the next step if the acquisition of images of all the abnormal regions to be observed is completed and, if not, continues from (F1) for the next abnormal region.

The above-described (E1) and (E2) are carried out.

The recognition of the stage position at the above-described (C6) is carried out according to the following two methods.

The first method is a method wherein the stage positions of alignment marks on a wafer or features at a predetermined distance from the alignment marks are automatically recognized using a normalized correlation coefficient from electron beam images or optical images obtained therefrom or images differentiated therefrom, the method being specifically carried out with the following steps.

(G1)) Alignment marks or features at a predetermined distance from the alignment marks are selected as features that can be easily recognized.

(G2) The positions of the above-described features on the inspector of foreign substances on wafer surface and electron beam images and optical images acquired from the features are registered in advance.

(G3) Those images and images acquired at (C5) or differential images thereof (images which are bright only along the contour thereof obtained with a Sobel, Laplacian or other type filter that utilizes differences between adjacent pixels) are matched according to the normalized correlation coefficient method.

The matching mentioned here is a method for finding a normalized correlation coefficient for overlaps between images obtained by shifting the images acquired at (C5) and the images acquired at (G2) and for finding an amount of shift which maximizes that value.

A normalized correlation coefficient can be expressed by the following equation.

For example, a normalized correlation coefficient for a two-dimensional array Xij and a two-dimensional array Yij is:

$$\Sigma(Xij-Xmean)(Yij-Ymean)/\sqrt{\{\Sigma(Xij-Xmean)(Xij-Xmean)\Sigma(Yij-Ymean)(Yij-Ymean)\}}$$

where, $\Sigma$ represents the sum of all i and j, and "mean" represents the average of the same.

The numerator $\Sigma(Xij-Xmean)(Yij-Ymean)$ is a correlation coefficient, and the denominator $\sqrt{\{\Sigma(Xij-xmean)(Xij-xmean)\Sigma(Yij-Ymean)(Yij-Ymean)\}}$ is a coefficient for normalization.

(G4) The amount of shift found as a result of the matching is converted into a distance in the coordinate system for the stage position.

(G5) The sum of this distance and the stage position as a result of the movement at (C4) is recognized as the stage position for the feature.

The second method is a method in which linear features or circular features are detected from electron beam images or optical images acquired from alignment marks on a wafer or features at a predetermined distance from the alignment marks and in which the stage positions of the features are automatically recognized. It is specifically carried out with the following steps.

(H1) Alignment marks or features at a predetermined distance from the alignment marks are selected as features that can be easily recognized.

(H2) The positions of the above-described features on the inspector of foreign substances on wafer surface and electron beam images and optical images acquired from the features are registered in advance.

(H3) Linear images, circular images and the like are detected from those images and images acquired at (C5) using a method such as Hough conversion. Hough conversion is a technique to convert a dot sequence into a line segment. A line segment can be detected even from a dot sequence having discontinuation.

(H4) An amount of shift is found based on the correspondence of the linear features and circular features.

(H5) It is converted into a distance in the coordinate system of the stage position.

(H6) The sum of this distance and the stage positions as a result of the movement at (C4) is recognized as the stage positions of the features.

At the above-described (D3), a partial image of an abnormal region is recognized from an image of the abnormal region using a method "in which a electron beam image or optical image which is a repetitive feature including an abnormal region is an image of the abnormal region; an image obtained by shifting the same images at a repetitive interval is a reference image; and the two images are compared to automatically recognize the partial image of the abnormal region". Specifically, the following steps (J1) through (J6) are carried out.

(J1) As a pre-process, noises are eliminated with a smoothing filter or the like. Here, "noises" are pulse noises and the like (The S/N ratio of SEM is very poor).

(J2) The image of the abnormal region and the reference image are matched. Specifically, the reference image is shifted such that the value of the normalized correlation coefficient is maximized.

Here, the reference image is obtained by shifting the image of the abnormal region at a repetitive interval.

Here, the matching is to find a normalized correlation coefficient for an overlap between an image obtained by shifting the image of the abnormal region by the amount described below and the image of the abnormal region and to find an amount of shift that maximizes this coefficient.

The range of the amount of shift:

repetitive interval X (1−α) to repetitive interval X (1+α)

where α is a number greater than 0 and less than 1 which depends on an error of the repetitive interval.

The repetitive interval is obtained using an automatic method utilizing autocorrelation or a method utilizing a value input by an operator.

Autocorrelation is often used to check the periodicity of a pattern.

For example, autocorrelation r(a, b) for a two-dimensional array Xij can be expressed as follows.

$$\Sigma(X_{ij}-X_{mean})(X_{i+a\ j+b}-X_{mean})/\sqrt{\{\Sigma(X_{ij}-X_{mean})(X_{ij}-X_{mean})\Sigma(X_{i+a\ j+b}-X_{mean})(X_{i+a\ j+b}-X_{mean})\}}$$

where Σ represents the sum of all i and j; "mean" represents the average of the same; and r(0, 0) is 1.

For example, when xij is a pattern having periods, r(a period in the X-direction, a period in the Y-direction) is also 1.

Further, autocorrelation is related to the autoregressive method and power spectrum method.

(J3) Noises are eliminated by using each pixel in an image of an abnormal region as a reference pixel, finding the pixel having a value closest to the reference pixel in the neighborhood of a pixel in a reference image corresponding to that pixel and substituting the value for the pixel value in the reference image.

The noise elimination is carried out for each pixel of the image of an abnormal region with the following steps.

Figure 4:
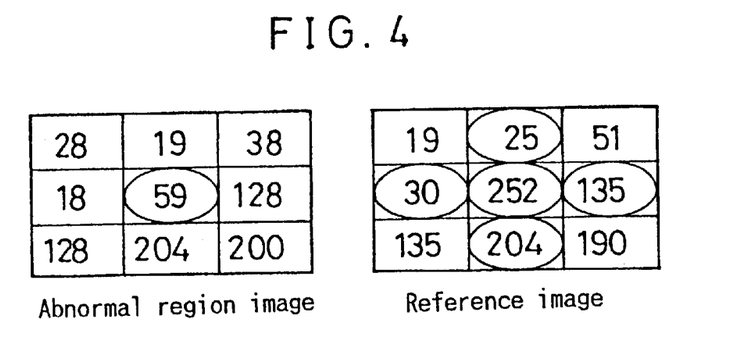
FIG. 4 is a diagram for explaining a method for eliminating noises in a reference image utilizing each pixel in an image of an abnormal region as a reference pixel.

FIG. 4 is an illustration for explaining the method of eliminating noises in the reference image using each pixel in the image of an abnormal region.

A pixel $X_R$ of the reference image corresponding to a pixel $X_D$ of the image of an abnormal region is found. In FIG. 4, the density of the pixel $X_D$ is 59, and the density of the pixel $X_R$ is 252. Here, "density" is the value of a pixel. Here, it means an amount of secondary electrons which has been subjected to A-D conversion using data 0 through 255.

The density of the pixel $X_R$ or the pixel above, under, to the left or to the right of the same whichever closest to the density of the pixel $X_D$ is substituted for the density of the pixel $X_R$. Referring to FIG. 4, 30 is chosen from among 25, 30, 252, 135 and 204.

It is apparent that this operation has eliminated 252 which is a peak noise.

(J4) A pixel of the abnormal region is detected using the sum of square of the difference between a pixel value of the image of the abnormal region and a pixel value of the corresponding reference image.

This process is carried out as follows for each pixel of the image of the abnormal region.

A rectangle (referred to as "detection rectangle") is formed which is centered at a pixel of the image of the abnormal region and a pixel of the reference image corresponding to the same. The lengths of the sides are empirically determined as parameters.

Pixels in the rectangle are paired to calculate an evaluated value P of the abnormal region as follows.

If P is smaller than a preset value, the pixel is a pixel of an abnormal region.

$I_R(X,y)$: a pixel value of the reference image $I_D(X,Y)$: a pixel value of the image of the abnormal region (x and y are coordinates after matching)

N: the number of pixels in the detection rectangle $N_T$: the number of pixels in a rectangle where the image of the abnormal region and the reference image overlap Σ: The sum in the detection rectangle $\Sigma_T$: The sum in the rectangle where the image of the abnormal region and the reference image overlap mean: The average in the rectangle where the abnormal region and the reference image overlap $$P=[\Sigma_T\{I_R(X,Y)-I_{Rmean}\}^2 N/N_T]/[\Sigma\{I_D(X,Y)-I_R(X,Y)\}2]$$

(J5) Pixels of a ghost abnormal region are eliminated.

Figure 5:
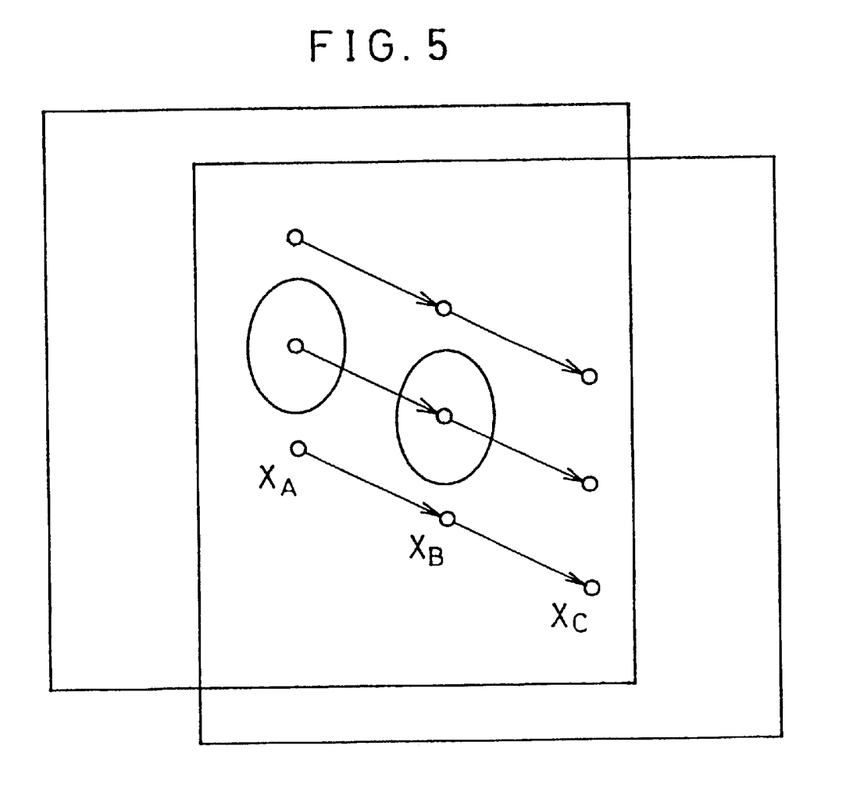
FIG. 5 shows the elimination of pixels in an image of a ghost abnormal region.

Since the reference image and the image of the abnormal region are identical, the pixel of the abnormal region is detected in two locations as shown in FIG. 5. One of them is referred to as "ghost abnormal region". In other words, it is a normal pixel in an image of a foreign substance corresponding to a defective foreign substance in a reference image.

A description is made here on a method in which the pixel in the circle on the right hand side is a pixel in a ghost abnormal region. As processing steps for eliminating the pixel of the ghost abnormal region, the following process is carried out for each pixel of the image of the abnormal region.

An evaluated value $P_A$ of the abnormal region for a pixel $X_A$ of the image of the abnormal region and an evaluated value $P_B$ for a pixel $X_B$ apart therefrom by the amount of the shift of the image are found, and the value $P_A$ or $P_B$ whichever is greater is substituted for $P_A$.

(J6) A partial image of the abnormal region is collectively formed by pixels of the abnormal region obtained at (J5).

In the above-described (F5), an electron beam image or optical image including an abnormal region is used as an image of the abnormal region; an image on a different die corresponding to this image is used as a reference image; and those two images are compared to recognize a partial image of the abnormal region automatically.

Specifically, the following steps (K1) through (K6) are carried out.

(K1) As a pre-process, noises are eliminated with a smoothing filter or the like.

(K2) The image of the abnormal region and the reference image are matched.

Here, the image of the abnormal region and the reference image are different images.

Here, the matching is to find a normalized correlation coefficient for an overlap between an image obtained by shifting the reference image and the image of the abnormal region and to find an amount of shift which maximizes this coefficient. While the amount of shift can be so large as to eliminate the overlap, a smaller amount of shift is desirable. Therefore, the absolute value of the amount of shift multiplied by a negative constant is added to the normalized correlation coefficient as a penalty.

(K3) The pixel values of the image of the abnormal region or reference image are rewritten such that the image of the abnormal region and the reference image have the same histogram to simulate the image.

(K4) Noises are eliminated by using each pixel in an image of an abnormal region as a reference pixel, finding the pixel having a value closest to the reference pixel in the neighborhood of a pixel in a reference image corresponding to that pixel and substituting the value for the pixel value in the reference image.

(K5) Pixel of the abnormal region are detected using the sums of square of the difference between pixel values of the image of the abnormal region and pixel values of the corresponding reference image.

A partial image of the abnormal region is collectively formed by pixels obtained at (K6) and (K5).

At the above-described (D4) and (F6), the type of an abnormal region is automatically classified based on quantities that characterize a partial image of the abnormal region recognized at (D3) and (F5) and quantities that characterize an image of the abnormal region and a reference image corresponding to the partial image. It is specifically carried out using the following method.

The quantities that characterize a partial image of an abnormal region include:

the area of the abnormal region converted from the number of pixels therein;

the ratio between the area of a rectangle approximated therefrom and the above-described area (The rectangle is approximated as follows. The directions of coordinate axes and values distributed along them are identified as in two dimensional analysis of major components, and a rectangle that covers about three times of the distributed values in the negative and positive directions is the rectangle to be obtained.);

the ratio between the long sides and short sides of the above-described rectangle;

the length of the boundary; and the number of regions:

The quantities that characterize an image of the abnormal region and a reference image corresponding to the partial image include:

the ratio between the average luminance of the image of the abnormal region and the average luminance of the reference image;

the ratio between the luminance distribution of the image of the abnormal region and the luminance distribution of the reference image;

the correlation ratio between the image of the abnormal region and the reference image; and the ratio between the sum of square of the gradient of the image of the abnormal region (the pixel values of a differentiated image thereof) and the sum of square of the gradient of the reference image.

A neural network or a membership function for which those characteristic quantities serve as variables is created to identify the type of the abnormal region automatically from the output value thereof.

The neural network or membership function is appropriately adjusted by an operator.

When accuracy of the stage is required, a method is used in which the stage position is moved to alignment marks or features at a predetermined distance from the alignment marks in the vicinity of observing positions when observing foreign substances or defects (referred to as "abnormal regions") as the stage is moved at (D1), (F1) and (F3), and the above-described features are recognized in the observing positions to correct any shift of the stage position automatically.

BRIEF DESCRIPTION OF THE DRAWINGS
[FIG. 1]

[FIG. 2]

[FIG. 3]

[FIG. 4]

[FIG. 5]

DETAILED DESCRIPTION OF THE PREFERRED EMBODIMENTS

Figure 1:
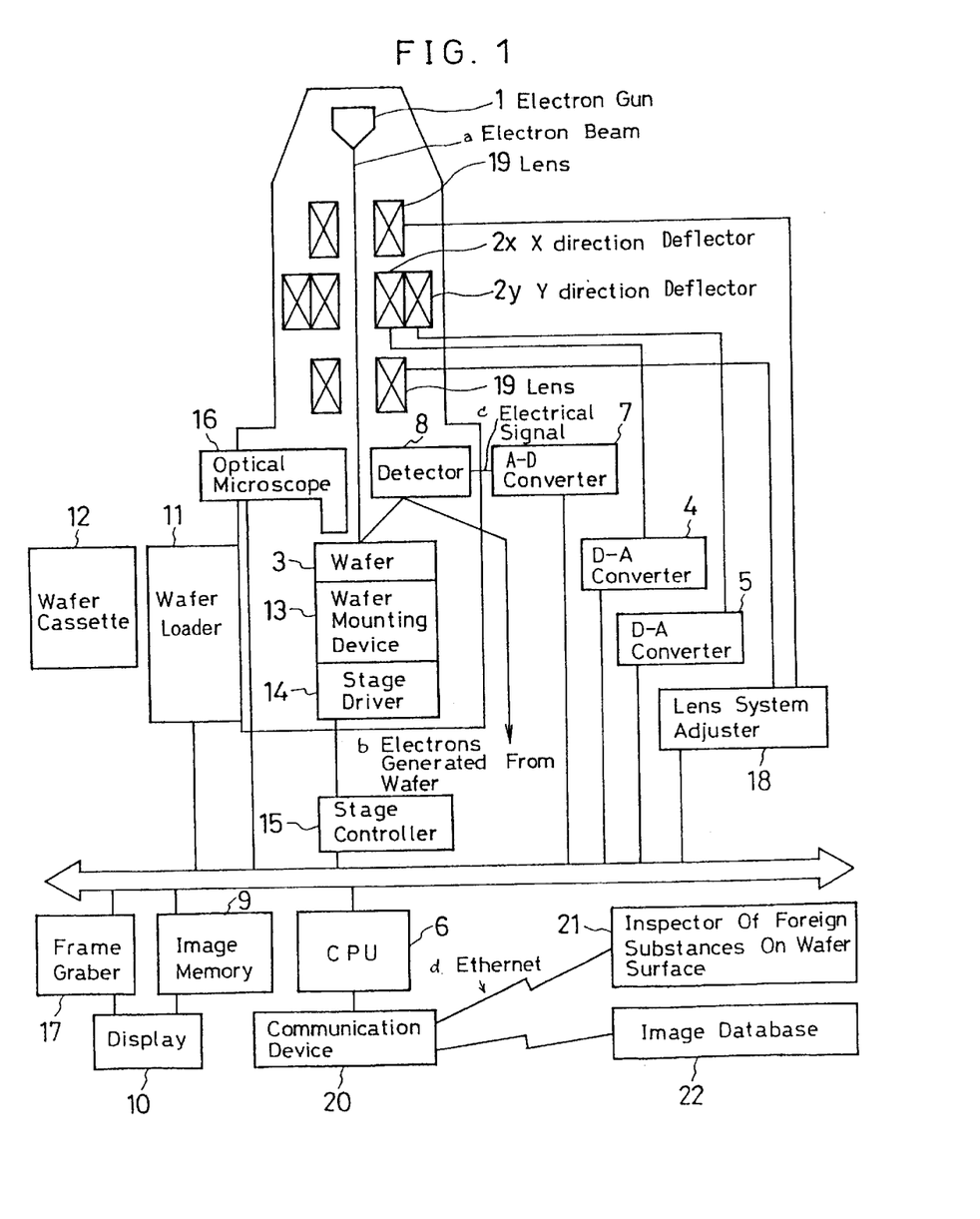
FIG. 1 shows a block diagram of an embodiment.

The present invention will now be described based on the illustrated embodiment. FIG. 1 shows an embodiment of the present invention.

An electron beam a generated by an electron gun 1 is deflected in an x-direction by a deflector 2x and deflected in a y-direction by a deflector 2y. The amounts of deflection are provided to a D-A converter 4 in the x-direction and a D-A converter 5 in the y-direction by a CPU 6. The outputs of the D-A converters 4, 5 are connected to the deflectors 2x and 2y.

When the CPU 6 performs an operation to read an A-D converter 7, electrons b generated from a wafer 3 are detected by a detector 8 and are converted into an electrical signal c the value of which is converted into a digital quantity to be received by the CPU 6. The CPU 6 writes the value read from the A-D converter 7 into an image memory 9. The contents of the image memory 9 are displayed on a display 10.

The wafer 3 is mounted by a wafer loader 11 from a wafer cassette 12 on to a wafer mounting device 13, and an observing position is controlled through a stage driver 14. Quantities for controlling the observing position are the position, inclination and the angle of rotation thereof on the wafer. An amount of stage movement as the above-described controlled value is provided to a stage controller 15 by the CPU 6. The output of the stage controller 15 is connected to the stage driver 14.

The output of an optical microscope 16 is converted into a digital quantity which is received by a frame graber 17. The optical microscope is effective in observing alignment patterns. A fringe can occur during the observation of an image with a low magnification using SEM. It becomes a kind of moire fringe because the beam diameter is very small. It may become invisible as a result of charge-up. There is another advantage in that an alignment mark can be generally easily determined by an operator because it is determined from an image in an optical microscope.

The contents of the frame graber 17 are directly displayed on the display 10. Further, the contents of the frame graber 17are transferred to the image memory 9 as needed. A lens system 19 is connected to a lens system adjuster 18 to be adjusted automatically. The CPU 6 provides instructions for automatic adjustment of the lens system such as automatic focusing to the lens system adjuster 18.

A communication device 20 is connected to the CPU 6. The communication device 20 communicates with an inspector 21 of foreign substances on wafer surface and an image database 22 through Ethernet d. It acquires the position and size of an abnormal region from the inspector 21 of foreign substances on wafer surface. An image of the abnormal region, information on classification and the like thus acquired are transferred to the image database 22 to be referred to by the operator.

Figure 2:
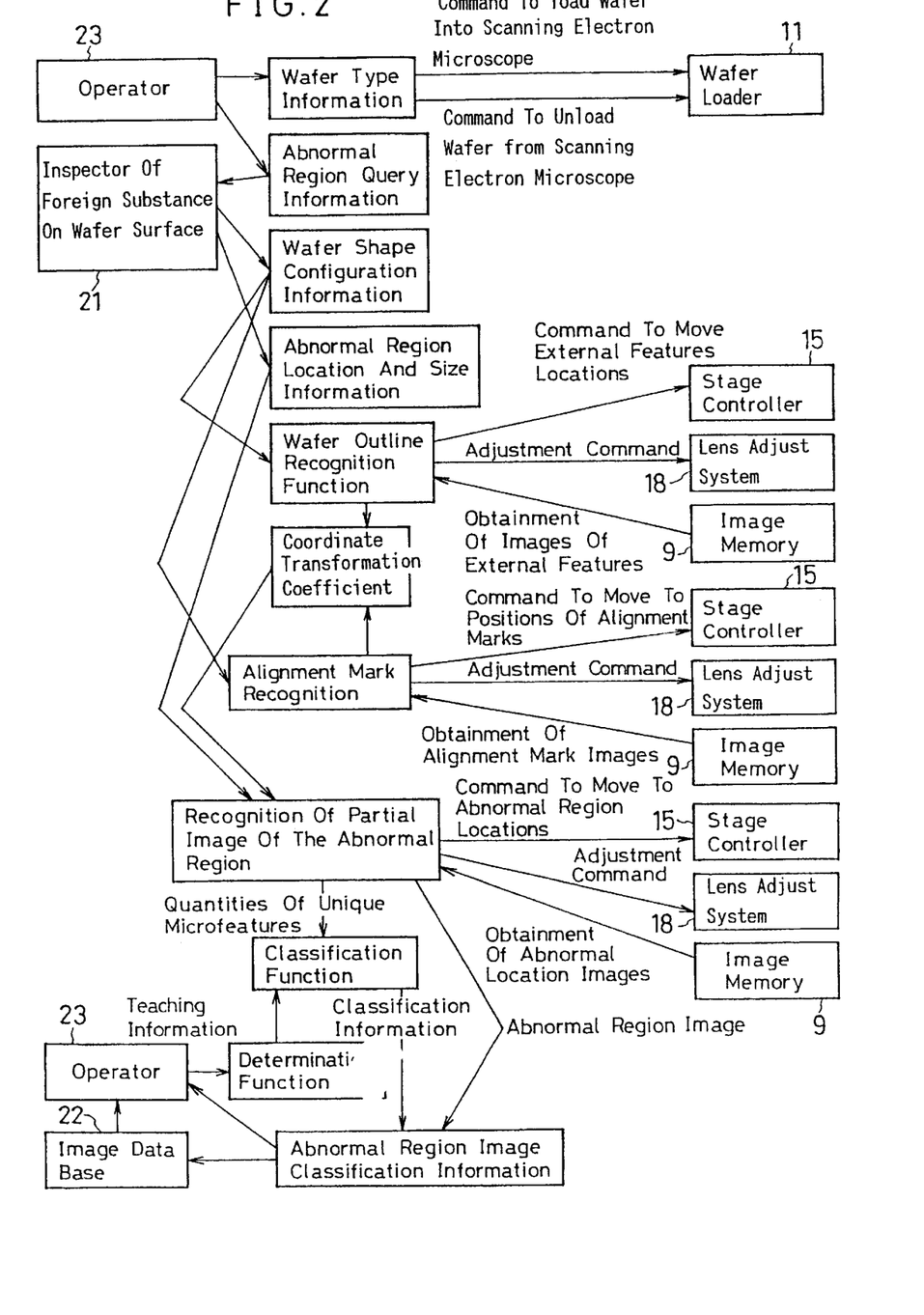
FIG. 2 shows a block diagram of a CPU process for a repetitive pattern observing method.
Figure 3:
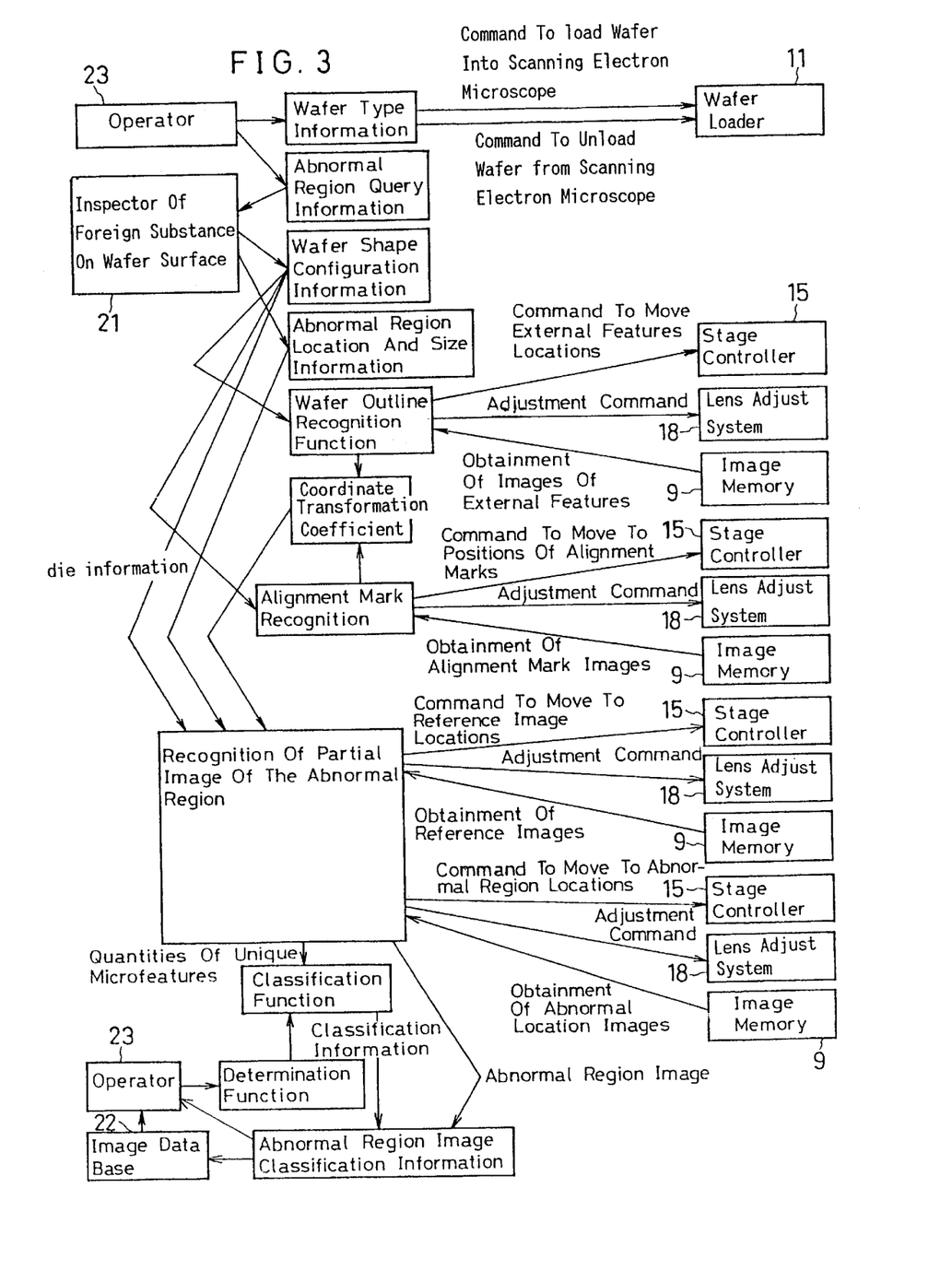
FIG. 3 is a block diagram of a CPU process for a die-to-die observing method.

FIG. 2 shows a block diagram of a CPU process for a repetitive pattern observing method. FIG. 3 shows a block diagram of a CPU process for a die-to-die observing method. In both of FIGS. 2 and 3, the blocks with descriptions therein preceded by a number correspond to reference numbers of components in FIG. 1. The rest of the blocks correspond to the CPU 6.

According to the present invention, an abnormal region can be detected by the following process with high sensitivity and stability. Specifically, a noise elimination method is used wherein each pixel in an image of an abnormal region is used as a reference pixel; the pixel closest to the value of the reference pixel is found in the vicinity of a pixel in a reference image corresponding to that pixel; and the same value is substituted for the value of the pixel in the reference image, thereby allowing enhanced noise elimination to eliminate peak noises, correct local shifts in matching and ignore microscopic differences between pattern widths. Further, influence of noises can be avoided by a method of detecting an abnormal region utilizing the sums of square of differences between pixel values in an image of an abnormal region and pixel values in a reference image, and stable operations are allowed by a method that utilizes differences in density, differences in density gradient and the like. It is easy to adjust parameters. The parameters are the number N of data of an evaluated value P of an abnormal region and an empirical threshold for P. Further, it involves a very simple calculation formula which can be easily transformed into a high speed operation type.

What is claimed is:

1. A method for automatically recognizing a stage position of a feature of a semiconductor wafer, comprising the steps of: identifying a feature of a semiconductor wafer disposed at a predetermined distance from an alignment mark on the semiconductor wafer; obtaining an electron beam image, an optical image or a differential image thereof of the feature-of the semiconductor wafer; calculating a normalized correlation coefficient from the image of the feature; and automatically recognizing a stage position of the feature of the semiconductor wafer in accordance with the normalized correlation coefficient.

2. A method for automatically recognizing a stage position of a feature of a semiconductor wafer, comprising the steps of: identifying a feature of a semiconductor wafer disposed at a predetermined distance from an alignment mark on the semiconductor wafer; obtaining an electron beam image or an optical image of the feature of the semiconductor wafer; detecting from the image of the feature a linear feature and a circular feature corresponding to the feature of the semiconductor wafer; and automatically recognizing a stage position of the feature of the semiconductor wafer in accordance with the detected linear feature and circular feature.

3. A method of automatically recognizing a partial image of an abnormal region on a semiconductor wafer, comprising the steps of: obtaining an electron beam image of an abnormal region on a semiconductor wafer; shifting the electron beam image at a repetitive interval using an auto-correlation method to obtain a reference image; and comparing the electron beam image and the reference image to automatically recognize a partial image of the abnormal region on the semiconductor wafer.

4. A method of automatically classifying the type of an abnormal region on a semiconductor wafer, comprising the step of: classifying the type of an abnormal region on a semiconductor wafer in accordance with quantities characterizing the partial image of the abnormal region automatically recognized according to claim 3 and quantities characterizing an image of the abnormal region and a reference image corresponding to the partial image.

5. A method of detecting an abnormal region on a semiconductor wafer, comprising the steps of: obtaining an image of an abnormal region on a semiconductor wafer; obtaining a reference image corresponding to the image of the abnormal region; and detecting the abnormal region on the semiconductor wafer using a ratio between the sum of square of a gradient of pixel values of the image of the abnormal region and the sum of square of a gradient of pixel values of the reference image.

6. A scanning electronic microscope comprising: an observation stage for observing a semiconductor wafer having an alignment mark and a feature disposed at a predetermined distance from the alignment mark; an automatic wafer loader for positioning the semiconductor wafer relative to the observation stage; and means for automatically recognizing a position of the observation stage relative to the feature of the semiconductor wafer by obtaining an electron beam image, an optical image or a differential image thereof of the feature, calculating a normalized correlation coefficient from the obtained image, and automatically recognizing the position of the observation stage in accordance with the normalized correlation coefficient.

7. In an imaging system having an observation stage for observing a semiconductor wafer, a method for automatically recognizing a position of the observation stage with respect to a given region of a semiconductor wafer, comprising the steps of: obtaining an image of the given region of a semiconductor wafer; calculating a normalized correlation coefficient from the obtained image; and automatically recognizing a position of the observation stage with respect to the given region of the semiconductor wafer in accordance with the normalized correlation coefficient.

8. A method according to claim 7; wherein the given region of the semiconductor substrate comprises an abnormal region or a region having process-related defects.

* * * * *